(12) United States Patent
Fidelman

(10) Patent No.: US 6,284,051 B1
(45) Date of Patent: Sep. 4, 2001

(54) COOLED WINDOW

(75) Inventor: Igor Fidelman, Nesher (IL)

(73) Assignee: AG Associates (Israel) Ltd., Migdal H'emek (IL)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/321,198

(22) Filed: May 27, 1999

(51) Int. Cl.$^7$ .................................................. C23C 16/00
(52) U.S. Cl. ........................... 118/724; 156/345; 118/50.1
(58) Field of Search .................................. 118/724, 725, 118/50.1; 156/345

(56) References Cited

U.S. PATENT DOCUMENTS

| | | | |
|---|---|---|---|
| 3,871,739 | * 3/1975 | Poulsen ..................................... | 350/1 |
| 4,431,257 | 2/1984 | Gunthard . | |
| 4,550,684 | 11/1985 | Mahawili . | |
| 5,008,593 | * 4/1991 | Schlie et al. ............................. | 315/39 |
| 5,145,716 | * 9/1992 | Paserin et al. .......................... | 427/55 |
| 5,487,127 | 1/1996 | Gronet et al. . | |
| 5,747,917 | * 5/1998 | Herchen ........................... | 313/231.31 |

FOREIGN PATENT DOCUMENTS

| | | |
|---|---|---|
| 0 424 183 | 4/1991 | (EP) . |
| 2 686 967 | 8/1993 | (FR) . |

* cited by examiner

Primary Examiner—Gregory Mills
Assistant Examiner—Luz Alejandro
(74) Attorney, Agent, or Firm—Nixon & Vanderhye P.C.

(57) ABSTRACT

A cooled window assembly for a thermal processing chamber, wherein an object in the chamber is heated by a radiation source outside the chamber emitting radiation that includes infrared radiation. The assembly includes upper and lower transparent plates defining passages therebetween. A cooling fluid flows through the passages, which fluid is substantially transparent to the infrared radiation, such that the infrared radiation from the source passes through the plates and through the fluid in the passages to heat the object. The upper plate is substantially thicker than the lower plate, thus providing the window with mechanical strength sufficient withstand atmospheric pressure when the chamber is evacuated.

10 Claims, 2 Drawing Sheets

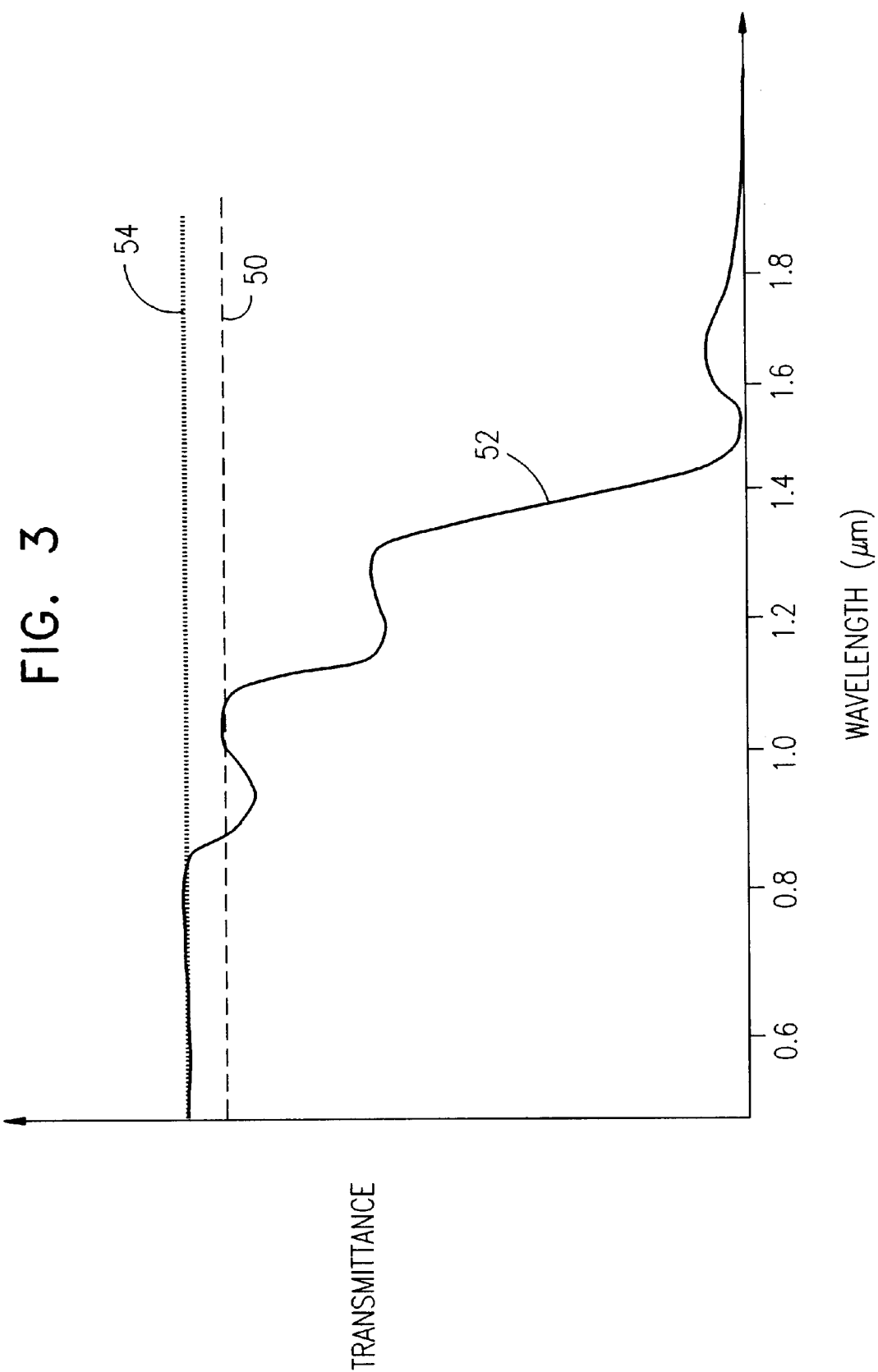

COOLED WINDOW

FIELD OF THE INVENTION

The present invention relates generally to semiconductor processing apparatus, and specifically to apparatus for radiant heating of semiconductor wafers.

BACKGROUND OF THE INVENTION

In rapid thermal processing of semiconductor wafers, a radiant source, such as a tungsten-halogen lamp or array of lamps, is commonly used to heat the wafer. A transparent window, typically made of quartz or sapphire, is used to separate the processing chamber from the heater. The window must be strong enough to withstand the pressure difference between the vacuum of the chamber and atmospheric pressure outside it, and therefore must be fairly thick. Quartz, however, is opaque to wavelengths above 4 $\mu$m, and also absorbs a small amount of radiation in the region between 0.2 to 4 $\mu$m. The total absorption grows with window thickness.

Under these conditions, in the absence of effective cooling, the window can reach high temperatures, typically up to 500° C., after a few process cycles in the chamber. A thick, hot window can affect the process in a number of undesirable ways:

"First wafer effect"—The first few wafers in a batch are processed before the window reaches its equilibrium temperature, and the repeatability of the process may therefore be affected.

Because of the low thermal conductivity of quartz, the temperature across the window may be non-uniform, thus affecting the uniformity of temperature across the wafer.

Some rapid thermal chemical vapor deposition (RTCVD) processes, such as polysilicon deposition, can also cause deposition of material on hot parts of the vacuum chamber, including the window. The deposition reduces window transmittance, so that more lamp power must be used to reach the desired wafer temperature. Deposition on the window can also affect process uniformity and repeatability.

Deposition on the window also increases the number of particles in the chamber, which can cause to contamination of the wafer, and leads to a requirement for more frequent cleaning.

Methods and apparatus for window cooling are known in the semiconductor processing art. For example, U.S. Pat. No. 4,550,684, to Mahawili, which is incorporated herein by reference, describes a vapor deposition system that uses a lamp to heat a wafer with radiation in the wavelength range between 0.3 and 0.9 $\mu$m. A window separates the lamp from a vacuum chamber containing the wafer. The window is constructed of two spaced-apart plates, between which water is pumped to control the window temperature. Although the water passing through the window absorbs infrared radiation emitted by the lamp, Mahawili considers this effect to be beneficial. He indicates that the desirable wavelength range for heating the wafer is between 0.3 and 0.9 $\mu$m, and wavelengths outside this range should be excluded from the chamber.

U.S. Pat. No. 5,487,127, to Gronet et al., which is incorporated herein by reference, describes rapid thermal heating apparatus in which lamps are disposed in a plurality of light pipes in order to illuminate and supply heat to a semiconductor substrate. The light pipes are integrated with a liquid-cooled window, which separates the lamps from an evacuated processing chamber. The window is constructed so that cooling water can be injected into spaces between the light pipes without entering or passing in front of the light pipes themselves. The light pipes themselves are evacuated. The radiation from the lamps thus reaches the chamber without being attenuated by the water, but the integrated structure of lamps, evacuated light pipes and cooled window is complex and difficult to construct and maintain.

SUMMARY OF THE INVENTION

It is an object of the present invention to provide an improved cooled window for use in radiative heating of a semiconductor wafer in a vacuum chamber.

In preferred embodiments of the present invention, a cooled window for a thermal process chamber comprises upper and lower layers of a suitable transparent material, preferably quartz, with passages between the layers through which a cooling fluid passes. The cooling fluid is chosen, unlike water, to have high transmittance in an infrared range of wavelengths above 1.1 $\mu$m, and preferably extending to above 1.4 $\mu$m. A radiant heater, preferably comprising an array of lamps, is configured and positioned to heat a semiconductor wafer in the chamber, such that the radiation from the heater, including both visible and infrared radiation, passes through the upper and lower layers of the window and through the cooling fluid and impinges on the wafer without substantial attenuation. Thus, the cooled window, of simple and robust structure, enables efficient delivery to the wafer of substantially the entire spectrum of useful radiation emitted by the lamp.

In preferred embodiments of the present invention, the thermal process chamber is evacuated during use, and the upper layer of the transparent material is made thick enough so that the window can withstand force exerted thereon due to the difference between ambient, atmospheric pressure outside the chamber and vacuum inside it. The lower layer is made substantially thinner than the upper layer, so that a lower surface of the lower layer, adjacent to the wafer, is thoroughly and uniformly cooled by heat conduction through the lower layer to the fluid. The lower layer would be too thin by itself to withstand the pressure difference across the window when the chamber is evacuated. But the lower layer is supported mechanically by a structure fixed between the upper and lower layers, which defines the passages through which the fluid flows and is configured so as to minimize blockage of radiation passing through the window.

There is therefore provided, in accordance with a preferred embodiment of the present invention, a cooled window assembly for a thermal processing chamber, wherein an object in the chamber is heated by a radiation source outside the chamber emitting radiation that includes infrared radiation, the assembly including:

upper and lower transparent plates defining passages therebetween; and a cooling fluid flowing through the passages, which fluid is substantially transparent to the infrared radiation, such that the infrared radiation from the source passes through the plates and through the fluid in the passages to heat the object.

Preferably, the cooling fluid is substantially transparent to radiation having a wavelength greater than 1.1 $\mu$m, and most preferably to radiation having a wavelength greater than 1.4 $\mu$m. Further preferably, the cooling fluid is substantially transparent to visible radiation. In a preferred embodiment, the cooling fluid includes a liquid fluorocarbon.

Preferably, the window assembly includes segments of a transparent material fixed between the upper and lower plates so as to define the passages, wherein the passages are generally aligned with a geometrical pattern of the radiation emitted by the radiation source.

Further preferably, the upper plate is substantially thicker than the lower plate, wherein the upper plate has a thickness sufficient so that the window assembly is able to withstand atmospheric pressure when the chamber is evacuated.

There is also provided, in accordance with a preferred embodiment of the present invention, a cooled window assembly for an evacuable thermal processing chamber, wherein an object in the chamber is heated by a radiation source outside the chamber, the assembly including:

an upper transparent plate, positioned adjacent to the radiation source and having a thickness sufficient so that the window assembly is able to withstand atmospheric pressure when the chamber is evacuated;

a lower transparent plate, positioned adjacent to the object in the chamber and having a thickness substantially less than the thickness of the upper transparent plate; and supporting pieces fixed between the upper and lower plates so as to provide mechanical support to the lower plate and arranged so as to define passages between the plates through which a cooling fluid passes to cool the plates.

Preferably, the passages are generally aligned with a geometrical pattern of the radiation emitted by the radiation source, so that radiation from the radiation source passes through the cooling fluid to reach the object in the chamber.

There is further provided, in accordance with a preferred embodiment of the present invention, heating apparatus for a thermal processing chamber, including:

a radiation source outside the chamber emitting radiation that includes infrared radiation; and a cooled window which seals the chamber and has passages therein through which a cooling fluid flows, which fluid is substantially transparent to the infrared radiation, so that the infrared radiation from the source passes through the fluid in the passages to heat an object in the chamber.

Preferably, the window includes upper and lower transparent plates defining the passages therebetween, wherein the upper plate is substantially thicker than the lower plate. Preferably, the upper plate has a thickness sufficient so that the window assembly is able to withstand atmospheric pressure when the chamber is evacuated.

Preferably, the radiation source includes an array of one or more lamps which emit the radiation in a predetermined geometrical pattern, and wherein the passages are generally aligned with the pattern. Most preferably, the pattern includes one or more rings.

There is also provided, in accordance with a preferred embodiment of the present invention, a method for heating an object in a thermal processing chamber, including:

sealing the chamber using a window having a passage therethrough;

heating the object by means of radiation passing through the window, the radiation including infrared radiation; and cooling the window by flowing an infrared-transparent fluid through the passage, such that the infrared radiation passes through the fluid substantially without attenuation.

The present invention will be more fully understood from the following detailed description of the preferred embodiments thereof, taken together with the drawings in which:

BRIEF DESCRIPTION OF THE DRAWINGS

FIG. 3 is a graph showing comparative measurements of window transmittance using different cooling fluids.

DETAILED DESCRIPTION OF A PREFERRED EMBODIMENT

Figure 1:
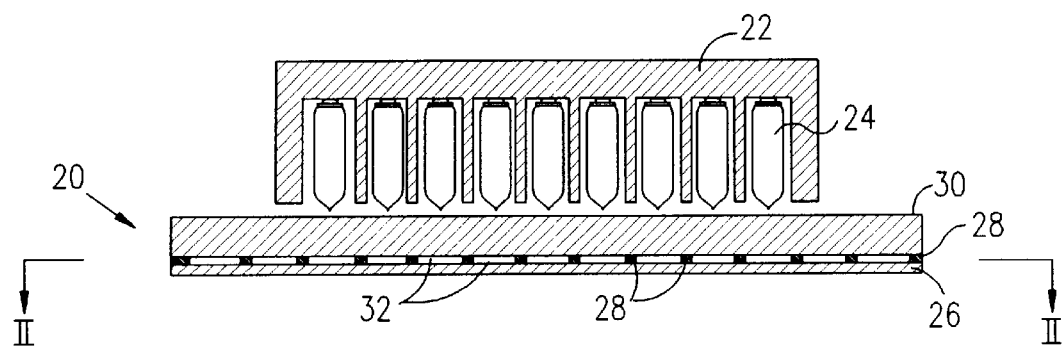
FIG. 1 is a schematic, sectional illustration of a lamp housing and cooled window, in accordance with a preferred embodiment of the present invention.
Figure 2:
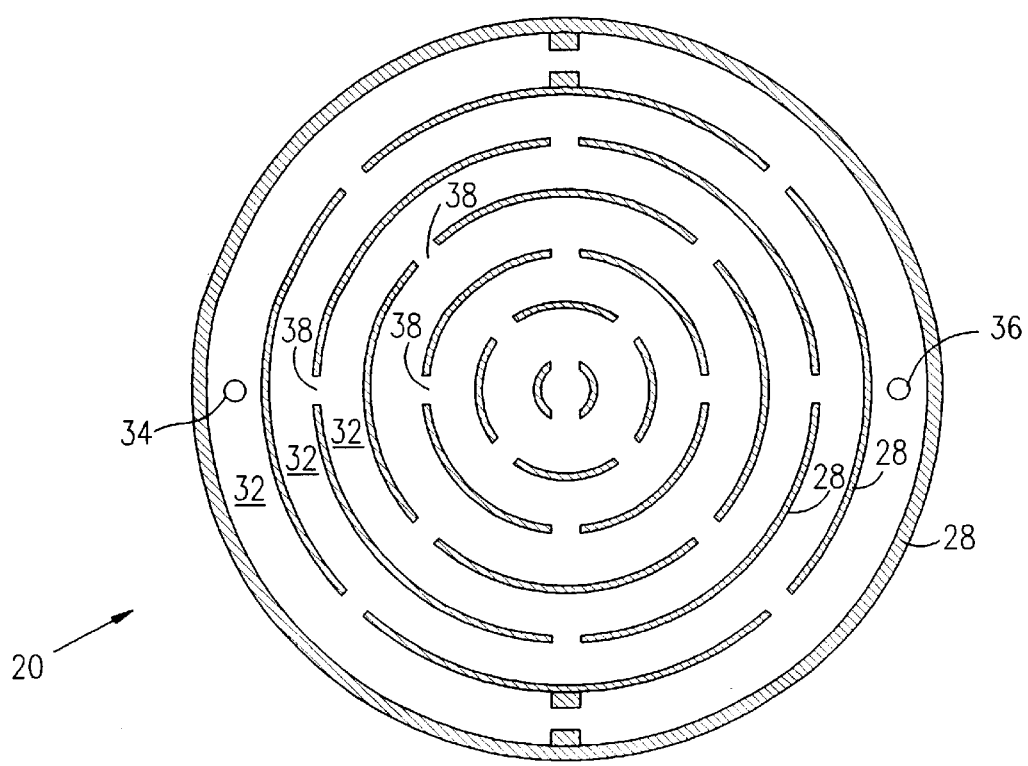
FIG. 2 is a cross-sectional view of the window of FIG. 1, taken along a line II—II.

Reference is now made to FIGS. 1 and 2, which schematically illustrate a heater assembly 22 and an accompanying cooled window 20, in accordance with a preferred embodiment of the present invention. Typically, radiant heat from the assembly passes through window 20 to heat a semiconductor wafer in an evacuated process chamber (not shown), most preferably a chamber for rapid thermal wafer processing, as is known in the art. FIG. 1 shows the heater assembly and window in a sectional view, while FIG. 2 is a cross-sectional view of the window along a line II—II in FIG. 1.

Window 20 comprises a lower plate 26 and an upper plate 30 separated by a middle layer 28 which defines cooling passages 32 within the window. Preferably, all three layers are made of quartz. Most preferably, lower plate 26 is between 5 and 6 mm thick, so that it can be thoroughly and uniformly cooled by conduction of heat to a flowing coolant in passages 32. If the plate were thicker, its lower surface, adjacent to the wafer, would not be adequately cooled by conduction through the plate, and undesirable effects, such as temperature nonuniformity and deposition of materials on the hot window surface, would be likely to occur. Preferably, the coolant is passed through a heat exchanger, so that plate 26 is maintained at a temperature no higher than 200° C. Upper plate 30 is preferably thicker, most preferably about 25 mm thick, so as to provide mechanical strength that is needed to withstand pressure differences between the chamber and ambient air.

Middle layer 28 preferably comprises a structure made up of thin arcuate segments 29, which are fixed between the upper and lower layers by diffusion welding or bonding with high-temperature cement, or using any other suitable method known in the art. At least one inlet 34 and one outlet 36 are provided which, along with openings 38, allow the coolant to flow through passages 32 and cool the entire window. The thickness and spacing of segments 29 are such that plate 26 is capable of withstanding the pressure of coolant in passages 32.

It will be understood that the structure of layer 28 and the pattern of passages therein is shown in FIG. 2 by way of example, and that other suitable structures and patterns may be designed based on considerations of thorough, uniform cooling and mechanical strength. The essential design criterion is that lower layer 26 be thin enough so that its lower surface can be maintained below a predetermined maximum temperature, such as 200°. In order to meet this criterion, layer 26 will typically be too thin by itself to withstand the pressure difference between vacuum on its lower side and ambient air or fluid pressure on its upper side. The requisite mechanical strength is provided by the thicker upper layer 30, against which lower layer 26 is supported. The principles of the present invention, as embodied in window 20, thus provide a simple, robust structure (by comparison with that described in the above-mentioned U.S. Pat. No. 5,487,127, for example), in which the lower surface of the window, opposite the wafer, can be adequately and uniformly cooled.

As shown in FIG. 1, segments 29 are preferably shaped and placed so that passages 32 are aligned with an array of lamps 24, which are arranged in concentric rings, in heater 22. Lamps 24 preferably comprise tungsten halogen lamps, such as JCV 240V-1500WGZ lamps, available from Ushio America Inc., Cypress, Calif. Alternatively, other types of lamps, such as linear lamps, and differently-configured lamp arrays may be used. Alignment of the passages with the lamps minimizes shadowing on the wafer due to segments 29, which might otherwise result in temperature non-uniformities and reduce heating efficiency.

FIG. 3 is a graph that schematically illustrates the measured transmittance of a test set-up designed to emulate optical properties of window 20, shown as a function of radiation wavelength for different coolant materials. As can be seen in the figure, the choice of coolant is of critical importance in determining the infrared transmittance of the window. A dashed line 50 shows window transmittance with air used as a coolant, wherein it is seen that the transmittance is generally uniform over the entire tested range of visible and near-infrared wavelengths. Air, however, is not effective enough as a coolant to keep plate 26 below the abovementioned target temperature of 200° C. A solid line 52 shows the transmittance with water used as the coolant, from which it is apparent that although water may be effective in keeping the window cool, it cuts off most of the infrared energy emitted by heater assembly 22, including substantially all of the energy at wavelengths over 1.4 µm.

The inventors have found that a heat transfer fluid of the fluorocarbon family provides an optimal combination of effective cooling with high infrared transmittance. A dotted line 54 in FIG. 3 shows results obtained using Galden HT135 or HT200 fluid, which are perfluorinated fluorocarbon fluids produced by Ausimont of Bollate, Italy. The refractive index (1.28) of Galden nearly matches that of quartz (1.45), so that reflective losses at the inner surfaces of plates 30 and 26 are reduced relative to air. Thus, Galden provides effective overall window transmittance comparable to that of air over the entire visible and near-infrared range.

Galden also has excellent compatibility with metal, plastic and elastomer materials and high oxidative resistance. It is thus superior to either air or water as a coolant, and enables window 20 and associated parts to be of simple, robust design and high transmittance over a wide wavelength range compared to cooled windows known in the art. It will be understood, however, that other infrared-transparent fluids may similarly be used.

It will be appreciated that the preferred embodiment described above is cited by way of example, and the full scope of the invention is limited only by the claims.

What is claimed is:

1. A cooled window assembly for a thermal processing chamber, wherein an object in the chamber is heated by a radiation source outside the chamber emitting radiation that includes infrared radiation, the assembly comprising:

upper and lower transparent plates segments of a transparent material fixed between the upper and lower plates so as to define passages therebetween; and a cooling fluid flowing through the passages, which fluid is substantially transparent to the infrared radiation, such that the infrared radiation from the source passes through the plates and through the fluid in the passages to heat the object.

2. The window assembly according to claim 1, wherein the cooling fluid is substantially transparent to radiation having a wavelength greater than 1.1 µm.

3. The window assembly according to claim 2, wherein the cooling fluid is substantially transparent to radiation having a wavelength greater than 1.4 µm.

4. The window assembly according to claim 1, wherein the cooling fluid is substantially transparent to visible radiation.

5. The window assembly according to claim 1, wherein the cooling fluid comprises a liquid fluorocarbon.

6. The window assembly according to claim 1, wherein the passages are generally aligned with a geometrical pattern of the radiation emitted by the radiation source.

7. A cooled window assembly for a thermal processing chamber, wherein an object in the chamber is heated by a radiation source outside the chamber emitting radiation that includes infrared radiation, the assembly comprising:

upper and lower transparent plates defining passages therebetween, wherein the upper plate is substantially thicker than the lower plate; and a cooling fluid flowing through the passages, which fluid is substantially transparent to the infrared radiation, such that the infrared radiation from the source passes through the plates and through the fluid in the passages to heat the object.

8. The window assembly according to claim 7, wherein the upper plate has a thickness sufficient so that the window assembly is able to withstand atmospheric pressure when the chamber is evacuated.

9. A cooled window assembly for an evacuable thermal processing chamber, wherein an object in the chamber is heated by a radiation source outside the chamber, the assembly comprising:

an upper transparent plate, positioned adjacent to the radiation source and having a thickness sufficient so that the window assembly is able to withstand atmospheric pressure when the chamber is evacuated;

a lower transparent plate, positioned adjacent to the object in the chamber and having a thickness substantially less than the thickness of the upper transparent plate; and supporting pieces fixed between the upper and lower plates so as to provide mechanical support to the lower plate and arranged so as to define passages between the plates through which a cooling fluid passes to cool the plates.

10. The window assembly according to claim 9, wherein the passages are generally aligned with a geometrical pattern of the radiation emitted by the radiation source, so that radiation from the radiation source passes through the cooling fluid to reach the object in the chamber.

* * * * *